(12) United States Patent
Bui et al.

(10) Patent No.: US 8,619,482 B1
(45) Date of Patent: Dec. 31, 2013

(54) PROGRAMMABLE PRECHARGE CIRCUITRY

(75) Inventors: John Henry Bui, Sunnyvale, CA (US); Triet M. Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 141 days.

(21) Appl. No.: 12/702,206

(22) Filed: Feb. 8, 2010

(51) Int. Cl.
*G11C 7/00* (2006.01)

(52) U.S. Cl.
USPC ............... 365/203; 365/189.05; 365/189.06; 365/189.09; 365/189.11; 365/230.06

(58) Field of Classification Search
USPC ............. 365/189.05, 189.06, 189.09, 189.11, 365/230.06, 203
See application file for complete search history.

(56) References Cited

U.S. PATENT DOCUMENTS

| | | | |
|---|---|---|---|
| 5,706,237 A * | 1/1998 | Ciraula et al. ............... | 365/222 |
| 5,802,003 A | 9/1998 | Iadanza et al. | |
| 5,875,139 A * | 2/1999 | Semi ........................... | 365/203 |
| 6,044,031 A | 3/2000 | Iadanza et al. | |
| 6,091,645 A | 7/2000 | Iadanza | |
| 6,147,893 A | 11/2000 | Liu | |
| 6,310,809 B1 | 10/2001 | Roohparvar et al. | |
| 6,346,846 B1 * | 2/2002 | Bertin et al. ................ | 327/525 |
| 6,490,199 B2 * | 12/2002 | Lee et al. .................... | 365/185.21 |
| 7,109,757 B2 * | 9/2006 | Yuan et al. .................. | 326/95 |
| 7,209,394 B1 * | 4/2007 | Dankert et al. ............. | 365/189.02 |
| 7,420,851 B2 * | 9/2008 | Fasoli .......................... | 365/185.25 |
| 7,977,977 B1 * | 7/2011 | Natarajan et al. ........... | 326/98 |
| 2009/0027983 A1 * | 1/2009 | Joshi et al. .................. | 365/203 |

* cited by examiner

*Primary Examiner* — Kretelia Graham
(74) *Attorney, Agent, or Firm* — Treyz Law Group; Jason Tsai (57) ABSTRACT

Integrated circuits with memory circuitry are provided. The memory circuitry may include rows of data line segments. Each data line segment may have associated memory cells, a programmable-strength precharge circuit, a latch circuit, a programmable-strength pull-up circuit, and a data line segment buffer. The precharge circuit may include multiple paths that can be switched into use depending on the configuration of programmable bits. The programmable-strength pull-up circuit may include multiple pull-up paths. The number of pull-up paths in use can be configured. The latch circuit may include a latch inverter that enables the programmable latch circuit during precharge operations. During a precharge period, the latch circuit can be disabled to block contending pull-down current and the data line segment buffer can be disabled to avoid crossbar currents.

18 Claims, 9 Drawing Sheets

PROGRAMMABLE PRECHARGE CIRCUITRY

BACKGROUND

This relates generally to integrated circuits, and more particularly, to integrated circuits with memory circuitry.

Integrated circuits often contain memory elements such as random access memory (RAM) cells. Integrated circuits that include memory cells typically have thousands of data lines (DL). Hundreds of memory cells are attached to each data line. During typical read operations, each data line on an integrated circuit is precharged to a positive supply voltage. Because the length of each data line is long (e.g., hundreds of microns in length) and because each data line is connected to hundreds of memory cells, the capacitance of each data line is fairly large.

During typical precharge operations, large precharge transistors are used to precharge respective data lines across an entire integrated circuit. The large precharge transistors are used to precharge the data lines to a known positive supply voltage. Because the data line capacitances are large, precharging thousands of data lines simultaneously can result in a current surge (e.g., a surge on the order of 5 A in magnitude). The current surge can temporarily cause the internal power supply of the integrated circuit to sag to an undesirably low level. This raises a risk that the integrated circuit may fail to function properly.

Integrated circuits are also susceptible to process, voltage, and temperature (PVT) variations. It is difficult to accurately model these variations in simulation when designing conventional precharge circuitry. Conventional precharge transistors are therefore often over-designed (e.g., sized larger than necessary) to be able to function properly in worst case scenarios.

It would therefore be desirable to be able to provide improved precharge circuitry such as precharge circuitry that can minimize the current surge so that internal power supply voltages do not sag to low levels during precharge operations.

SUMMARY

Integrated circuits may be provided with memory circuitry that includes data register circuitry coupled to multiple rows of data line segments. The data register circuitry may have data registers that are used in reading or writing data for respective rows of data line segments.

A data line segment may form part of an associated data line. The data line may be connected to multiple memory cells, precharge and latch circuitry, and buffer circuitry. The buffer circuitry may include read circuitry that detects a value stored in a memory cell. Each memory cell may be controlled by a corresponding address signal.

The precharge and latch circuitry may include a programmable precharge circuit, a latch circuit, a programmable latch circuit, and a data line segment buffer. The programmable precharge circuit and the programmable latch circuit have programmable strengths and may therefore sometimes be referred to as a programmable-strength precharge circuit and a programmable-strength pull-up circuit. The latch circuit may include first and second series-connected n-channel metal-oxide-semiconductor (NMOS) transistors coupled between the data line and a ground line, first and second series-connected p-channel metal-oxide-semiconductor (PMOS) transistors coupled between a power line (e.g., a positive power supply line) and the data line, and a latch inverter. The latch inverter may have an input that is connected to the data line and an output. The first PMOS transistor may have a gate terminal that is connected to ground. The second PMOS transistor may have a gate connected to the output of the latch inverter. The first NMOS transistor may have a gate terminal that is connected to the output of the latch inverter. The second NMOS transistor may have a gate terminal that is controlled by a precharge control signal.

The data line segment buffer may include a logic gate such as a NAND gate and an even number of inverters connected in a chain. Each successive inverter in the chain of inverters may exhibit a greater drive strength than the previous inverter. The NAND gate may have a first input connected to the output of the latch inverter and a second input controlled by the precharge signal.

In one suitable arrangement, the programmable precharge circuit includes multiple pairs (groups) of series-connected PMOS transistors, where each pair of PMOS transistors is coupled between the power line and the data line. Each pair of series-connect PMOS transistors may include first and second precharge transistors. The first precharge transistors may have gate terminals that are controlled by the precharge signal. The second precharge transistors may have gate terminals that are connected to the outputs of respective storage elements. The values of static output signals from the storage elements may be determined by the values of bits stored in the storage elements.

The programmable latch (pull-up) circuit may also include multiple series-connected PMOS transistors. Each pair of PMOS transistors in the programmable latch circuit may be coupled between the power line and an intermediate node that is located between the first and second PMOS transistors in the latch circuit. Each pair of series-connect PMOS transistors may include first and second latch transistors. The first latch transistors may have gate terminals that are controlled by the precharge signal. The second latch transistors may have gate terminals that are connected to respective storage elements and that are controlled by programmable bits in the storage elements. The programmable bits in the programmable precharge circuit and the programmable latch circuit may be configured to provide desired precharge ramp rates.

If desired, the programmable precharge circuit may include multiple precharge PMOS transistors each of which is coupled between the power line and the data line. One of the multiple precharge transistors may have a gate terminal that is controlled by the precharge signal. The remaining precharge transistors may have gate terminals connected to respective NAND gate outputs. Each NAND gate may have a first input controlled by an inverted precharge signal and a second input that is connected to a respective storage element and that is controlled by a programmable bit.

The programmable latch circuit may include multiple PMOS transistors each of which is coupled between the power line and the intermediate node. The PMOS transistors may have gates connected to respective NAND gate outputs. Each NAND gate may have a first input that receives the inverted precharge signal and a second input that is connected to a respective storage element and that is controlled by a programmable bit.

The programmable-strength precharge circuit and the programmable-strength latch circuit may be configured using a pattern of programmable bits that provides a desired precharge ramp rate. The programmability of the precharge and latch circuits provides flexibility that enables the memory circuitry to operate properly in the presence of process, voltage, and temperature (PVT) variations that may arise in practice. Diode-connected biasing PMOS transistors may be inserted between the power supply line and the programmable PMOS transistors to provide enhanced control of the precharge ramp rates.

Further features of the present invention, its nature and various advantages will be more apparent from the accompanying drawings and the following detailed description.

DETAILED DESCRIPTION

Integrated circuits may be provided with memory circuitry. The memory circuitry may include memory cells such as random access memory (RAM) cells. Memory cells such as RAM cells may be used as configurable RAM (CRAM) or as part of a memory block (as examples).

Millions of memory cells may be formed on a single integrated circuit. The memory cells may be arranged in an array of rows and columns or other suitable arrangement. For example, memory cells may be formed in hundreds or thousands of rows and columns on a programmable integrated circuit such as a programmable logic device integrated circuit. An illustrative integrated circuit on which memory cells are formed is shown as integrated circuit 10 in FIG. 1.

Figure 1:
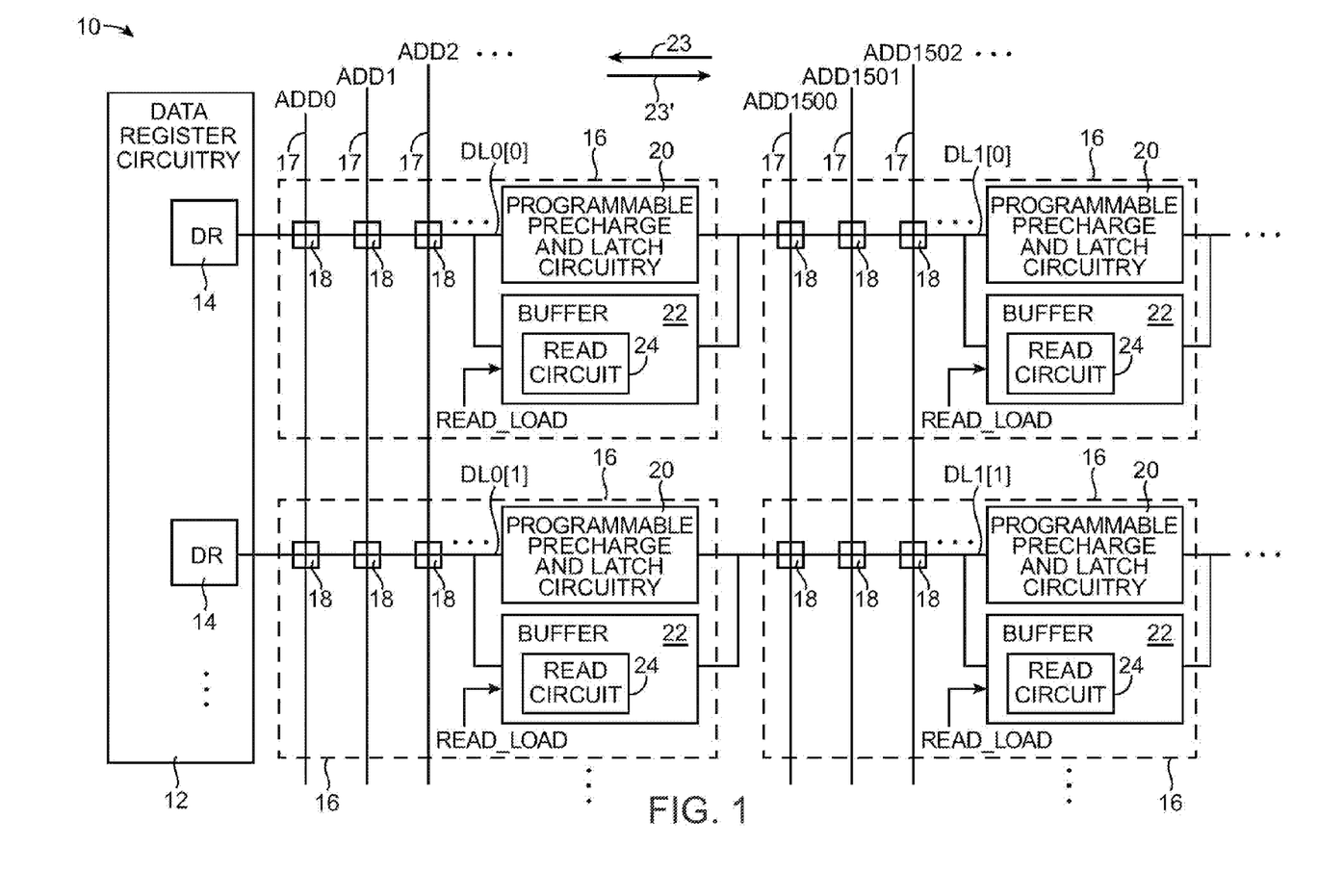
FIG. 1 is a circuit diagram of an illustrative integrated circuit with memory cells attached to respective data line segments in accordance with an embodiment of the present invention.

As shown in FIG. 1, data register circuitry such as data register circuitry 12 in a memory array on integrated circuit 10 may be coupled to multiple data lines (DL). Data register circuitry 12 may include data registers such as data registers 14. Data register circuitry 12 may include more than two data registers 14. For example, there may be 20 thousand data registers 14 in data register circuitry 12. Each data register 14 may be coupled to a group (e.g., a row) of data line segments such as data line segments 16. Hundreds or thousands of data line segments 16 may be arranged along a row corresponding to each data register 14.

For example, a data line segment 16 that is associated with a first row of data line segments and that is associated with a first column of data line segments may include data line DL0[0]. Another data line segment 16 that is associated with the first row and a second column of data line segments may include data line DL1[0]. In general, a data line segment that corresponds to the first row and the $(n+1)^{th}$ column includes data line DLn[0].

Similarly, a data line segment 16 that corresponds to a second row of data line segments and that corresponds to the first row may include data line DL0[1]. Another data line segment 16 that corresponds to the second row and the second column of data line segments may include data line DL1[1]. A data line segment that corresponds to the first column and the $(m+1)^{th}$ row in FIG. 1 may therefore include data line DL0[m]. In general, a data line segment corresponding to the $(n+1)^{th}$ column and to the $(m+1)^{th}$ row may include data line DLn[m]. For example, a data line segment that corresponds to the $19,001^{st}$ row and the $88^{th}$ column may include data line DL87[190,000]. Data line DL described hereafter may represent a generalized data line of any row or any column of data line segments.

Each data line segment 16 may include a data line, programmable precharge and latch circuitry such as programmable precharge and latch circuitry 20, buffer circuitry such as buffer circuitry 22, and memory cells such as memory cells 18. Hundreds or thousands of memory cells 18 can be connected to each data line DL. Memory cells 18 may be CRAM cells, general purpose SRAM cells, or other suitable types of memory cells. CRAM cells are loaded with configuration data and have outputs that supply corresponding static control signals to the gates of programmable transistors. General purpose SRAM cells may be used to implement blocks of memory for real-time data storage.

In a typical scenario, there may be 1,500 CRAM cells connected to data line DL in each data line segment. Memory cells 18 may be connected to respective address lines such as address lines 17. Address signals such as ADD0, ADD1, and ADD2 may be conveyed over address lines 17. An address line may be connected to a single memory cell 18 in an entire row of data line segments 16. This address line may be connected to multiple memory cells 18 that are located in other data line segments along a corresponding column. For example, only one memory cell in a first row of data line segments can be controlled by address signal ADD1. Address signal ADD1 may also control another memory cell in a second row, another memory cell in a third row, and so on. Address lines 17 carrying address signals ADDx (e.g., signals ADD0, ADD1, ADD2, etc.) may therefore be used to control memory cells along a single column of memory cells.

In a scenario in which there are 1,500 CRAM cells connected to each data line DL, address lines 17 connected to memory cells in a second column of data line segments 16 may be supplied with address signals ADD1500, ADD1501, ADD1502, etc. (as an example).

Programmable precharge and latch circuitry 20 may be used to precharge data lines during read operations. Circuitry 20 in each data line segment 16 can be used to precharge the data lines DL on an integrated circuit.

Buffer circuitry 22 may be a tri-state buffer and may include a read circuit such as read circuit 24. During read operations, read circuit 24 may be used to detect whether a logic "1" or a logic "0" is stored in a memory cell. Only a single memory cell in an entire row of data line segments 16 is generally read at a time (e.g., only one address signal is asserted during a read operation). In response to detection of a stored value (data) by read circuit 24, signal READ_LOAD may be asserted to direct buffer circuitry 22 to propagate the stored value in the direction of arrow 23 from one data line segment to the next until the stored data is latched by a corresponding data register 14. Operations that involve reading stored data in this way may sometimes be referred to as parallel loading operations, because assertion of a single address signal and signal READ_LOAD simultaneously loads read data into multiple data registers in a parallel fashion.

Buffer circuitry 22 may also be used to write data into desired memory cells 18. During write operations, data registers 14 may provide write data to the array of memory cells. A single memory cell in an entire row of data line segments 16 is written at a time (e.g., one address signal is asserted during a write operation). Buffer circuitry 22 may be used to propagate the write data in the direction of arrow 23' from one data line segment to the next until the data is written into the desired memory cells. Buffer circuitry 22 may therefore be referred to as a bidirectional buffer (i.e., a buffer that is operable in both directions as indicated by arrows 23 and 23').

Figure 2:
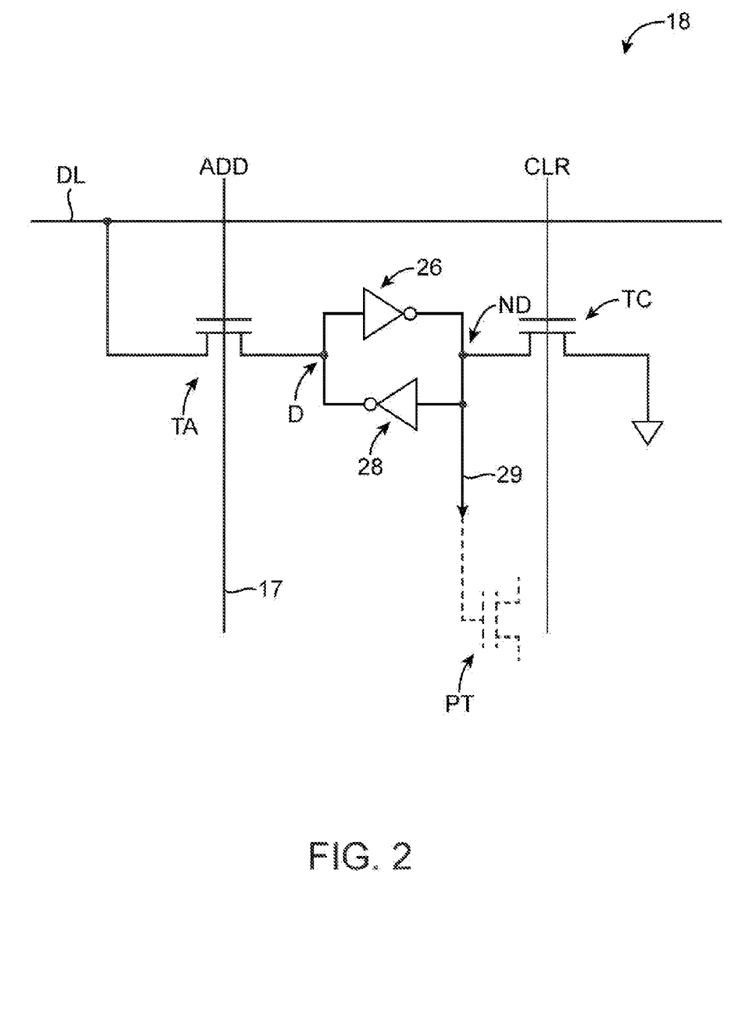
FIG. 2 is a circuit diagram of an illustrative memory cell of the type shown in FIG. 1 in accordance with an embodiment of the present invention.

An illustrative memory cell 18 of the type that may be used in connection with the circuitry of FIG. 1 is shown in FIG. 2. Memory cell 18 may include inverters such as inverters 26 and 28. Inverter 26 may have an input that is connected to an output of inverter 28. Inverter 26 may have an output that is connected to the input of inverter 28. Inverters 26 and 28 connected in this way may be referred to as a pair of cross-coupled inverters or a "latch."

A data signal such as data signal D may be stored at the output of inverter 28. A data signal such as data signal ND may be stored at the output of inverter 26. Data signals D and ND may be complements (or inverses) of each other. For example, in a scenario in which data signal D has a logic value of "1," data signal ND will have a logic value of "0." In a scenario in which data signal D has a logic value of "0," data signal ND will have a logic value of "1."

Data signal ND may be provided over output line 29 as a static control signal. This control signal may be used to control programmable logic circuitry on an integrated circuit to customize the programmable logic circuitry to perform desired logic functions (as an example). In a typical arrangement, each static output signal serves as a gate control signal that is applied to a gate terminal of transistor such as transistor PT.

The input of inverter 26 may be connected to a transistor such as address transistor TA. Transistor TA may be an n-channel metal-oxide-semiconductor (NMOS) device. A transistor may have four terminals such as a source terminal, a drain terminal, a gate terminal, and a bulk (body) terminal. The terms "source" and "drain" may be used interchangeably, so source and drain terminals are sometimes each referred to as "source-drain" terminals.

The input of inverter 26 may be connected to a source-drain terminal of transistor TA. The other source-drain terminal of transistor TA may be connected to data line DL. Data line DL of FIG. 2 may represent a generic data line that is associated with any of the data lines and the data line segments in FIG. 1. The gate terminal of transistor TA may be connected to address line 17. Address signal ADD may be provided over line 17 to control address transistor TA to write into memory cell 18 during a write operation or to read from memory cell 18 during a read operation (as an example). The bulk terminal of transistor TA may be connected to a ground line.

The output of inverter 26 may be connected to a transistor such as clear transistor TC. Transistor TC may be an NMOS device. The output of inverter 26 may be connected to a source-drain terminal of transistor TC. The other source-drain terminal of transistor TC may be connected to ground (i.e., the ground line). Transistor TC may have a gate terminal controlled by a global or semi-global clear signal CLR. Clear signal CLR may be asserted during reset operations to force data signal ND to a logic "0" (i.e., data signal D is forced to a logic "1"). The bulk terminal of transistor TC may be tied to ground.

Memory cell 18 of FIG. 2 includes six transistors. Memory cell 18 may have fewer than six transistors or more than six transistors, if desired (e.g., a memory cell may have more than two pairs of inverter circuits). A memory cell need not have a clear transistor. A memory cell may be connected to two data lines (e.g., data line DL and a complementary data line such as data line NDL) instead of just one data line to enable a differential reading scheme, if desired. Memory cell 18 of FIG. 2 is merely illustrative.

Figure 3:
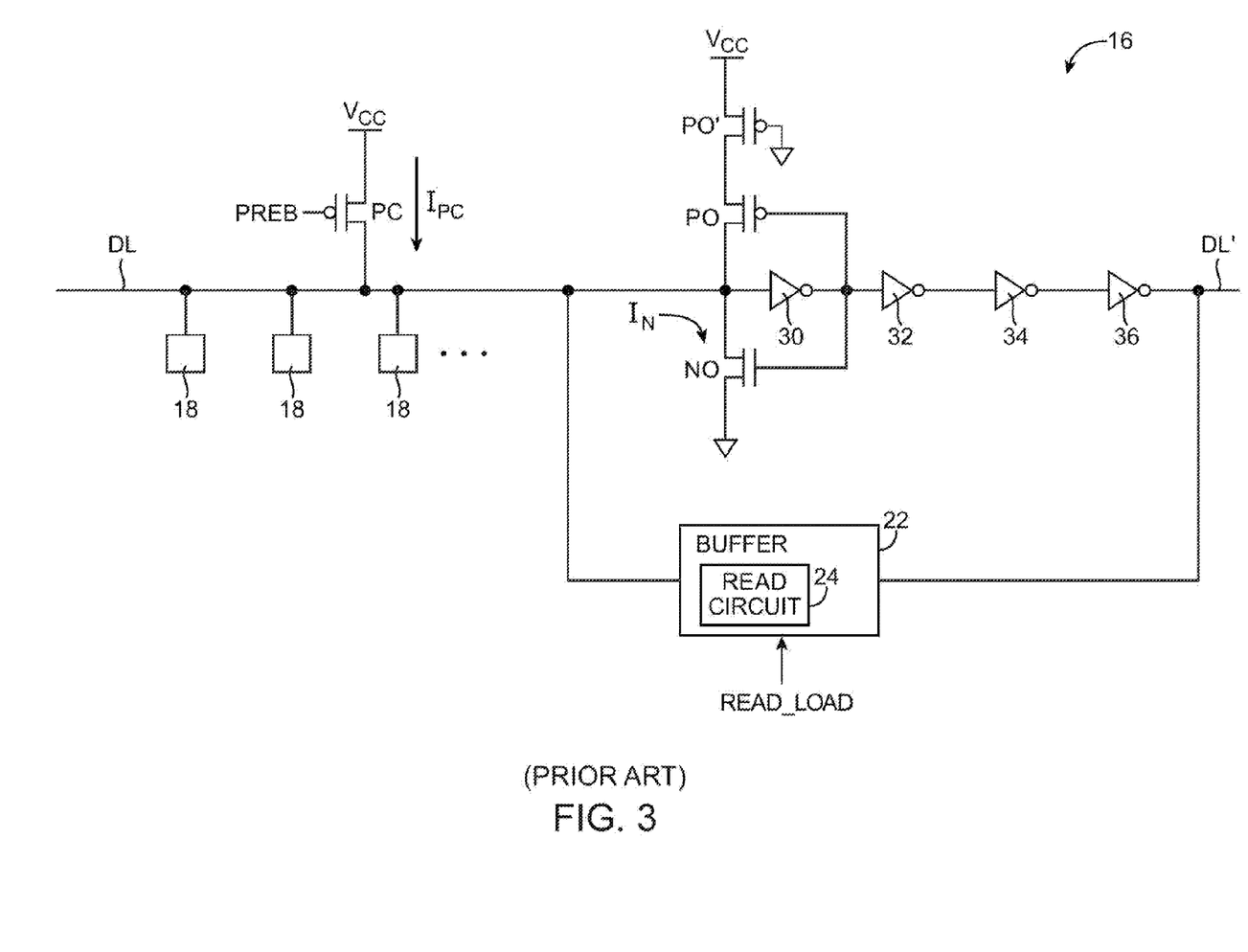
FIG. 3 is a circuit diagram of a data line segment that has conventional precharge circuitry.

A conventional data line segment is shown in FIG. 3. There are hundreds of memory cells 18 connected to conventional data line DL of FIG. 3. Conventional precharge transistor PC is also connected to data line DL. Transistor PC is a p-channel metal-oxide-semiconductor (PMOS) device. Transistor PC has source and bulk terminals that are powered by positive power supply voltage Vcc. Supply voltage Vcc is supplied over a positive power supply line. Transistor PC has a drain terminal that is connected to data line DL. Transistor PC has a gate terminal that is controlled by global precharge signal PREB.

A conventional latch circuit is also connected to data line DL. The conventional latch circuit includes NMOS transistor N0, PMOS transistors P0 and P0', and inverter 30. Inverter 30 has an input that is connected to data line DL. Transistor N0 has a drain terminal that is connected to data line DL, source and bulk terminals that are connected to ground, and a gate terminal connected to an output of inverter 30.

Transistors P0 and P0' are connected in series between the power supply line and data line DL. Transistor P0' has a source terminal connected to the power supply line at positive voltage Vcc and a gate terminal connected to ground (0 V). Transistor P0 has a drain terminal connected to data line DL and a gate terminal connected to the output of inverter 30.

The output of inverter 30 is connected to a chain of three inverters (inverters 32, 34, and 36). Inverter 34 has greater drive strength than inverter 32, and inverter 36 has greater drive strength than inverter 34. Inverter 36 has an output that is connected to a next data line such as data line DL' located in an adjacent data line segment. For example, consider a scenario in which data line DL represents data line DL32 [11000]. Data line DL' in this scenario would correspond to data line DL33[11000] (increment column index by 1). Buffer circuitry 22 is connected to data lines DL and DL' to facilitate read and write operations.

In preparation for a read operation, data line DL is precharged. Prior to precharging, data line DL often exhibits a low voltage value (e.g., zero volts or close to zero volts). Because the input of inverter 30 is connected to data line DL and data line DL is initially at a low voltage level, the output of inverter 30 exhibits a high voltage value. Because the output of inverter 30 is connected to transistors N0 and P0, transistor N0 is placed in an on state and transistor P0 is placed in an off state during precharge. Current $I_N$ may flow through transistor N0 to pull data line DL down towards zero volts.

Precharge signal PREB is asserted to begin precharging data line DL. Assertion of signal PREB turns on transistor PC to begin pulling data line DL up towards power supply voltage Vcc. Transistor PC is sized relatively large in comparison to transistor N0 to overpower contending pull-down current $I_N$ flowing through transistor N0. Additionally, the hundreds of memory cells that are attached to data line DL present large parasitic capacitances (e.g., greater than 5 pF) on data line DL. Current $I_{PC}$ flowing through transistor PC must be large enough to overpower opposing current $I_N$, must be large enough to overpower the leakage currents that are flowing through the thousands of memory cells on data line DL, and must be large enough to charge up the large parasitic capacitances in a given precharge time period.

Precharging all the data lines on an integrated circuit in this way requires the simultaneous running of currents $I_{PC}$ through numerous precharge transistors PC. This can result in an aggregate current surge of up to 5 A from the positive power supply line (as an example). Such high amounts of current surge can temporarily lower power supply voltage Vcc to a level that risks undesirably causing an integrated circuit to malfunction.

Figure 4:
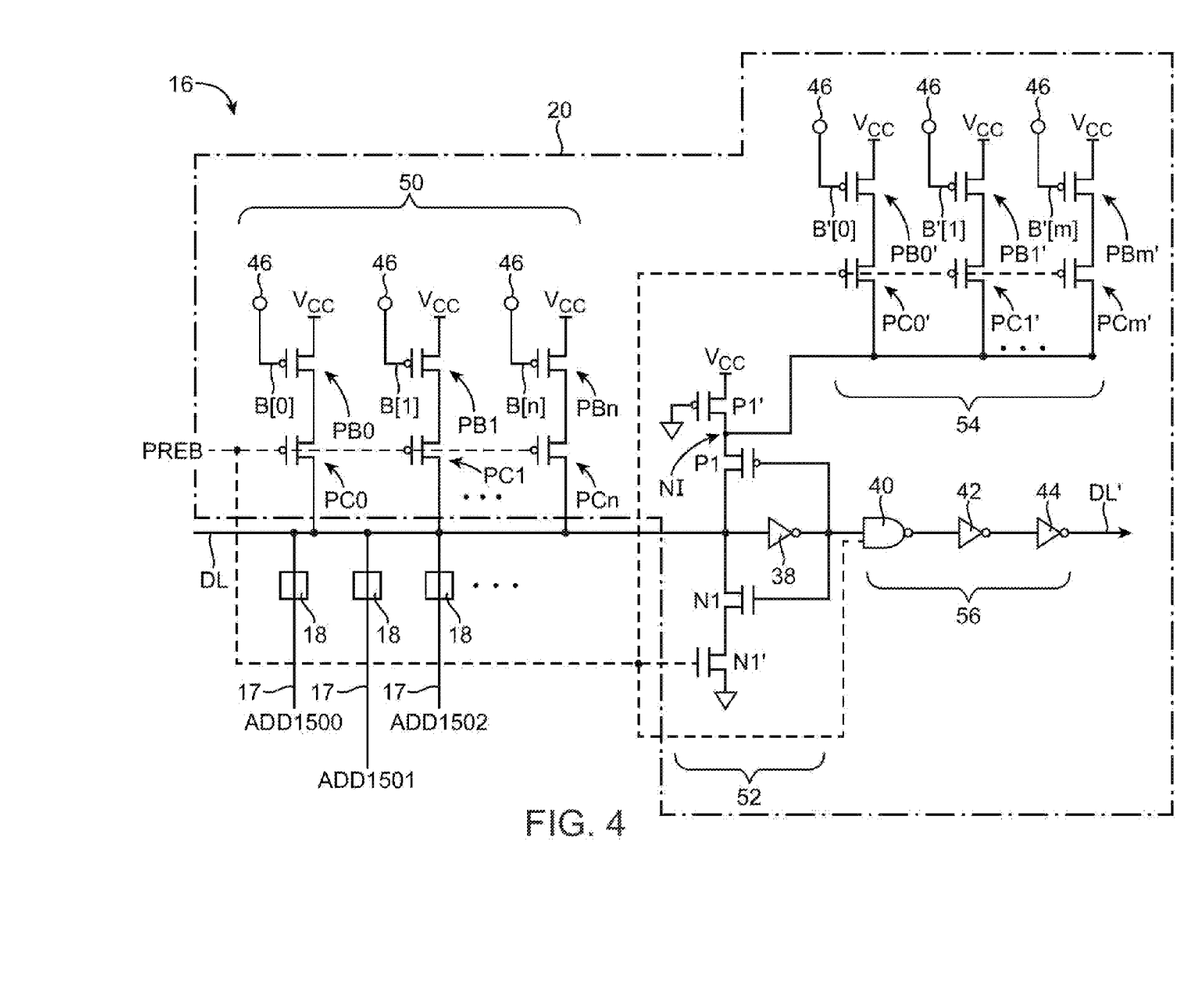
FIG. 4 is a circuit diagram of an illustrative data line segment with programmable precharge and latch circuitry in accordance with an embodiment of the present invention.

To avoid excessive current surges and otherwise enhance performance, integrated circuit 10 may be provided with precharge and latch circuits of the type shown in connection with FIG. 4. As shown in FIG. 4, data line segment 16 may include a programmable precharge circuit such as programmable precharge circuit 50, a latch circuit such as latch circuit 52, a programmable latch circuit such as programmable latch circuit 54, and a data line segment buffer such as data line segment buffer 56. The programmability of the precharge and latch circuits provides flexibility that enables the memory circuitry to operate properly in the presence of process, voltage, and temperature (PVT) variations that may arise in practice.

There may be multiple memory cells 18 connected to data line DL. Memory cells 18 may be connected to address lines 17 carrying address signals such as signals ADD1500, ADD1501, and ADD1502 (as an example). More than three memory cells may be connected to data line DL. For example, 2,000 memory cells may be connected to data line DL in each data line segment 16.

Programmable precharge circuit 50 may serve to precharge data line DL at an initial rate that is dependent on the strength of circuit 50. Programmable latch circuit 54 (also referred to as a programmable pull-up circuit) may be enabled when data line DL exceeds a given intermediate voltage level to help circuit 50 pull up the data line at a secondary rate that is higher than the initial rate. Circuit 54 may therefore help shorten the amount of time required to precharge data line DL. The secondary rate is dependent on the strength of circuit 54. Because the initial and secondary rates are dependent on the strength of circuits 50 and 54, circuits 50 and 54 may be referred to as a programmable-strength precharge circuit and a programmable-strength pull-up circuit, respectively.

Programmable precharge circuit 50 may be connected to data line DL. Circuit 50 may include multiple pairs (groups) of series-connected precharge PMOS transistors. For example, a first pair of precharge transistors may include transistors PB0 and PC0 connected in series. Transistors PB0 and PC0 may be coupled between a power supply line that is powered at positive voltage Vcc and data line DL. Transistor PB0 may have a source terminal connected to the positive power supply line and a gate terminal connected to a storage element such as storage element 46. Storage element 46 may be a volatile memory element (e.g., a CRAM cell loaded with configuration data, etc.) or a nonvolatile memory element (e.g., fuses, antifuses, electrically-programmable read-only memory elements, etc.). Storage element 46 may provide a programmable control bit such as bit B[0] that controls transistor PB0. For example, if bit B[0] has a logic value "0," transistor PB0 will be turned on. If bit B[0] has a logic value "1," transistor PB0 will be turned off.

Transistor PC0 may have a drain terminal connected to data line DL and a gate terminal controlled by global precharge signal PREB. If desired, transistors PB0 and PC0 may switch positions so that the source terminal of transistor PC0 is connected to the power supply line and the drain terminal of transistor PB0 is connected to data line DL.

Circuit 50 may include a second pair of series-connected precharge PMOS transistors. The second pair of precharge transistors may include transistors PB1 and PC1. The second pair of precharge transistors may be configured in the same way as the first pair of precharge transistors, except that transistor PB1 has a gate terminal connected to another storage element 46 and is controlled by bit B[1]. Circuit 50 may have more than two pairs of series-connected precharge transistors. In general, circuitry 50 may include (n+1) pairs of series-connected precharge transistors. The $(n+1)^{th}$ pair may include transistors PBn and PCn, where transistor PBn is controlled by bit B[n]. The gates of transistors PBx (i.e., transistors PB0, PB1, . . . PBn) may be controlled by respective programmable bits to adjust the strength of circuit 50. The gates of transistors PCx (i.e., transistors PC0, PC1, . . . PCn) may be controlled by signal PREB to turn circuits 50 on and off.

Latch circuitry 52 may include NMOS transistors such as transistors N1 and N1', PMOS transistors such as transistors P1 and P1', and inverter 38. Inverter 38 may have an input connected to data line DL. Transistors P1 and P1' may be coupled between the power supply line and data line DL. Transistor P1' may have a source terminal connected to the positive power supply line, a gate terminal connected to a ground power supply line, and a drain terminal connected to an intermediate node NI. Transistor P1 may have a source terminal connected to intermediate node NI, a drain terminal connected to data line DL, and a gate terminal connected to the output of inverter 38.

Transistors N1 and N1' may be connected in series and may be coupled between data line DL and the ground line. Transistor N1 may have a drain terminal connected to data line DL and a gate terminal connected to the output of inverter 38. Transistor N1' may have a source terminal tied to the ground line and a gate terminal controlled by signal PREB. If desired, transistors N1 and N1' may swap positions without altering their gate terminal connections.

Programmable pull-up circuit 54 may be connected to intermediate node NI. The configuration of circuit 54 may be similar to the configuration of circuit 50. Circuit 54 may have multiple pairs of series-connected PMOS pull-up transistors coupled between the power supply line and intermediate node NI. Each pair of PMOS transistors may include first pull-up (PMOS) transistor PBx' (e.g., transistor PB0', PB1', . . . , or PBm') and a corresponding second pull-up transistor PCx' (e.g., transistor PC0', PC1', . . . , or PCm') that are connected in series. Transistors PBx' may have gates connected to respective storage elements 46. Storage elements 46 may provide programmable bits B'[x] (i.e., B'[0], B'[1], . . . B'[m]) that control transistors PBx' and thereby adjust the strength of circuit 54. Transistors PCx' may each have a gate terminal that is controlled by signal PREB to turn on or off circuit 54. In general, the $(m+1)^{th}$ transistor pair in circuit 54 may include transistors PBm' and PCm', where transistor PBm' is controlled by bit B[m].

Circuit 54 may have a different number of transistor pairs than circuit 50. For example, circuit 50 may have 32 storage elements 46 that control 32 pairs of series-connected precharge transistors while circuit 54 may have 16 storage elements 46 that control 16 pairs of series-connected PMOS transistors. The transistor pairs in circuit 54 may provide different pull-up drive strengths (e.g., using different transistor widths) than the transistors pairs in circuit 50, if desired. The programming bits (configuration data) in cells 46 result in static control signals at the outputs of cells 46 that are used to configure circuits 50 and 54. Dynamic control signals may also be used, if desired.

Each PMOS and NMOS transistor shown in FIG. 4 may have bulk terminals connected to the power supply line and the ground line, respectively. If desired, the bulk terminals may also be tied to the source of each transistor.

The output of inverter 38 may be connected to data line segment buffer 56. Line segment buffer 56 may include a logic gate such as NAND gate 40, inverter 42, and inverter 44 connected in series. Gate 40 may have a first input connected to the output of inverter 38 and a second input controlled by signal PREB. Gate 40 may be referred to as a gating stage, because when signal PREB has logic value "0," the output of NAND gate 40 remains fixed at logic value "1." Setting signal PREB at a low voltage may therefore disable gate 40 to prevent any signal from propagating through this gating stage.

Inverter 44 may have an output that drives a data line DL' in an adjacent data line segment. Inverter 42 may have greater drive strength than gate 40 (e.g., inverter 42 may be formed using wider transistors than the transistors used in gate 40). Inverter 44 may have greater drive strength than inverter 42 (e.g., inverter 44 may be formed using wider transistors than the transistors of gate 42). Any number of inverters may be used in buffer 56, if desired. For example, there may be more than two inverters, four inverters, six inverters, or ten inverters.

Figure 5:
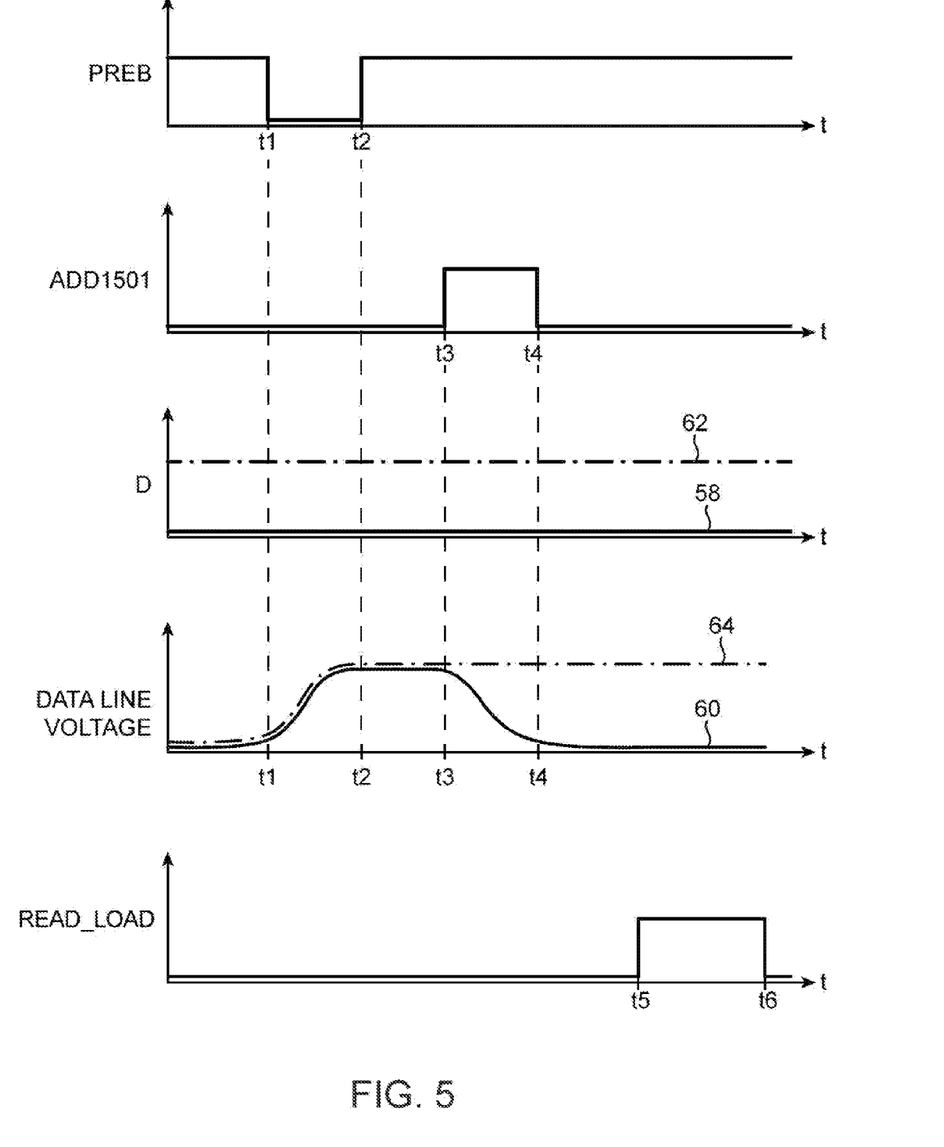
FIG. 5 is a timing diagram illustrating a read operation in accordance with an embodiment of the present invention.

Data may be read from a desired memory cell. FIG. 5 is an illustrative timing diagram showing how relevant signals may be adjusted during a read operation. Under normal operating conditions, signal PREB may be high (e.g., at logic value "1"), address signals such as signal ADD1501 may be low (e.g., at logic value "0"), signal D of a memory cell of interest may be low as shown by curve 58 (as an example), the voltage value of data line DL may be low, and signal READ_LOAD may be low.

Circuit 50 and 54 may be provided with a desired pattern of programmable bits prior to time t1 (e.g., during set up operations). This adjusts the strength of circuits 50 and 54 to desired levels. From time t1 to t2, signal PREB may be asserted (e.g., pulled low, because PMOS transistors are turned on when their gates are driven to low voltages) to precharge data line DL. The time period from t1 to t2 may be referred to as a precharge period (phase). Circuit 50 and 54 may be able to pull the data line voltage to a high value before time t2 (see, e.g., curve 60).

From time t2 to t3, only latch circuit 52 is actively holding data line DL high (e.g., transistors P1 and P1' are both on). From time t3 to t4, signal ADD1501 may be asserted to select the memory cell to read. Only a single address signal may be asserted to select a memory cell from each row of data line segments. Memory cell 18 may discharge data line DL to pull the data line voltage to a low voltage value if memory cell 18 is storing a "1" (i.e., data signal D is low). For proper operation, transistor P1' should be weak enough to allow a single memory cell to be able to discharge data line DL in this way.

If, for example, signal D were initially high (see, e.g., dotted curve 62), the data line voltage will remain high (dotted curve 64). For proper operation, transistor P1' should therefore be strong enough to maintain data line DL high in the presence of leakage currents flowing through the hundreds of memory cells attached to data line DL.

Signal READ_LOAD may be asserted from time t5 to t6 to load read data into data registers 14. Values corresponding to signals D in each of the selected memory cells may be loaded into corresponding data registers 14. If desired, inverted versions of signals D (i.e., values corresponding to signals ND in each of the selected memory cells) may be loaded into data registers 14.

Figure 6:
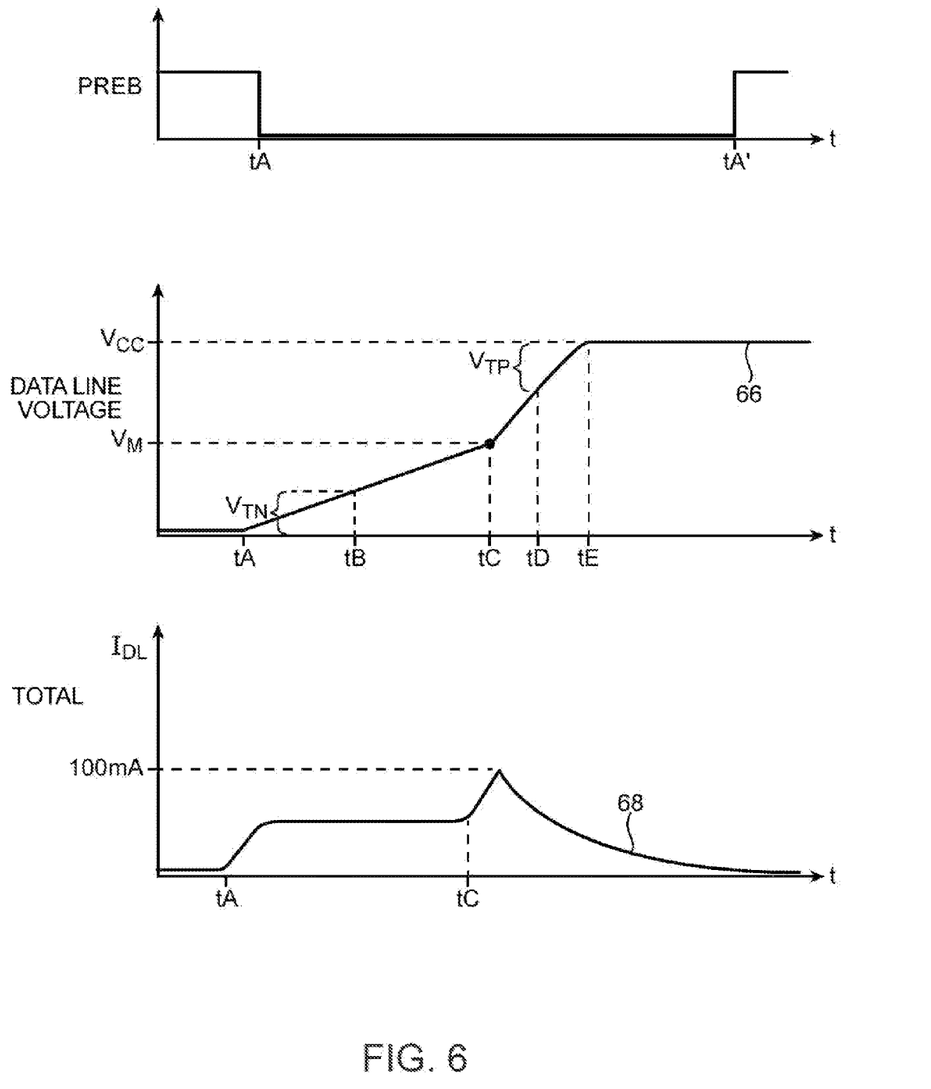
FIG. 6 is a timing diagram illustrating an acceptable current surge during precharge operations in accordance with an embodiment of the present invention.

FIG. 6 illustrates in detail the behavior of relevant signals during the precharge period. Precharge signal PREB is asserted during the precharge period from tA to tA', as shown in FIG. 6. The data line voltage (curve 66) may ramp (charge) up at a first rate from time tA to tC. The first rate may be dependent on the pull-up strength of programmable precharge circuit 50. The first rate can be adjusted by configuring programmable bits B[x] appropriately. For example, consider a scenario in which four of 16 pairs of series-connected precharge transistors are enabled in circuit 50 by configuring four out of 16 programmable bits B[x] to logic "0." A data line segment configured in this way may have a given first rate. Consider another scenario in which eight of the 16 pairs of series-connected precharge transistors are enabled in circuit 50 by configuring eight of the 16 bits B[x] to logic "0." A data line segment configured in this way may exhibit a pull-up rate that is higher than the given first rate. If desired, the first ramp rate may also be lowered by disabling more precharge transistors (e.g., configuring more bits B[x] to logic "1").

Inverter 38 may have switching voltage level $V_M$. If the input of inverter 38 exceeds $V_M$, the output of inverter 38 may flip to output a logic "0." When the data line voltage exceeds $V_M$ (at time tC), inverter 38 outputs a "0" to turn on transistor P1. From time period tC to tE, the data line voltage may ramp up at a second rate. The second rate may depend on a combined pull-up strength of programmable precharge circuit 50 and of programmable latch circuit 54.

The second rate may be greater than the first rate. The second rate can similarly be increased by enabling more pairs of PMOS transistors (e.g., by programming more bits B'[x] to logic "0"). Circuit 54 may serve to assist in precharging data line DL after time tC until the data line voltage is charged up to supply voltage Vcc. With the arrangement of FIG. 4, the programmable bits that control circuits 50 and 54 may be configured to adjust the precharge ramp rates to satisfy desired design criteria (e.g., desired operating frequencies).

There may be a time period after assertion of signal PREB during which inverter 38 operates in a switching region (e.g., both NMOS and PMOS transistors of inverter 38 are partially on). For example, the switching region may correspond to a time period from tB (when the data line voltage exceeds voltage $V_{TN}$) to tD (when the data line is at voltage $V_{TP}$ less than the supply voltage level). Voltage $V_{TN}$ and $V_{TP}$ may correspond to threshold voltages of the NMOS and PMOS transistors of inverter 38.

When inverter 38 is operating in the switching region, its output may be driven to an intermediate level between zero volt and supply voltage Vcc. In a typical scenario, a gate following another gate that is operating in the switching region will also tend to operate in the switching region. Gates operating in the switching region may consume undesirable current. The undesirable current arises in this way during gate switching regions may be referred to as a "crowbar" current. Gate 40 may serve to prevent crowbar currents from flowing, because signal PREB disables gate 40 in the switching region and forces gate 40 to output a static non-intermediate voltage value (e.g., a logic "1") during the precharge phase from time tA to tA'.

As shown in FIG. 6, total data line current $I_{DL}$ (curve 68) may exhibit a current peak of 100 mA during precharge (as an example). The current peak may occur immediately after time tC when both circuits 50 and 54 are turned on. Circuit 54 helps shorten the time required for data line DL to charge up to positive supply voltage Vcc while maintaining an acceptable current peak. The current peak is kept reasonably low, because the data line voltage is already charged up to an intermediate voltage level when circuit 54 is enabled. This reduces the total current required by circuit 54 to help pull up the data line. Curve 68 may gradually drop off when the data line voltage is fully charged up to supply voltage Vcc. Current $I_{DL}$ may reflect the sum of all the currents flowing through circuits 50 and 54 in all the data line segments across an entire integrated circuit.

The total current peak shown in the example of FIG. 6 is 50 times (5 A divided by 100 mA) smaller than the 5 A current surge associated with conventional precharge circuitry. This reduction in current surge can be attributed to turning off transistor N1' during the precharge period. The gate of transistor N1' is controlled by signal PREB. Signal PREB is pulled low during the precharge period, which turns off transistor N1'. As a result, no direct contention current exists to pull data line DL down towards ground. The absence of an opposing pull-down current allows the precharge transistors such as the transistors in circuit 50 to be sized smaller than transistor PC of FIG. 3. Smaller precharge transistors may substantially reduce the current surge during precharge operations.

Figure 7:
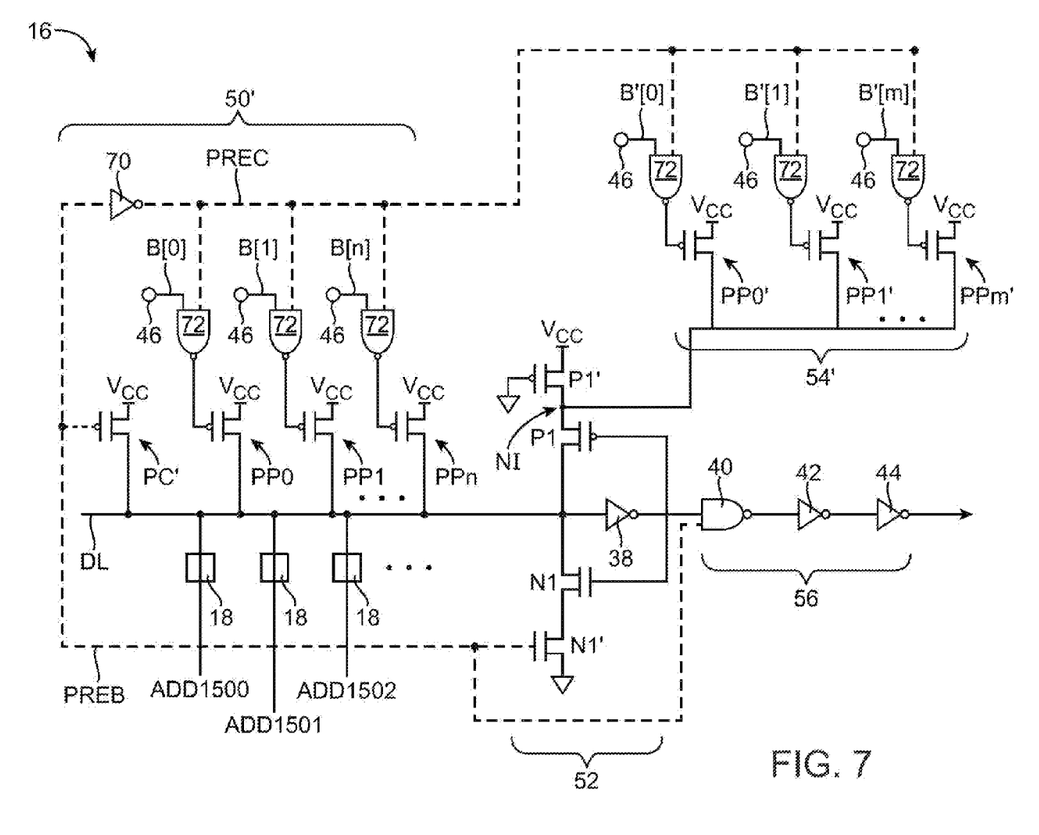
FIG. 7 is a circuit diagram of an illustrative data line segment with programmable precharge and latch circuitry in accordance with an embodiment of the present invention.

Another suitable arrangement of forming a programmable precharge circuit such as programmable precharge circuit 50' is shown in FIG. 7. Circuit 50' may include transistor PC' and multiple programmable precharge transistors PP0, PP1, etc. Transistor PC' and the programmable precharge transistors may be PMOS transistors that are coupled between the power supply line and data line DL. Transistor PC' may have a gate terminal controlled by signal PREB. Transistor PC' may remain on during the entirety of the precharge period. Transistor PC∝ may serve as a nominal pull-up transistor for data line DL.

The gates of the multiple programmable precharge transistors (e.g., transistors PP0, PP1, etc.) may be controlled by outputs of control gates such as NAND gates 72. Each NAND gate 72 may have a first input controlled by a programmable bit B[x] from a respective memory element 46 (e.g., a CRAM cell or nonvolatile element). Each NAND gate 72 may have a second input controlled by a control signal such as control signal PREC. An inverter such as inverter 70 may receive signal PREB and output signal PREC. Signal PREC is therefore an inverted version of signal PREB. During the precharge period, signal PREB may be low and signal PREC may be high. When signal PREC is high, gates 72 may be used to turn on the programmable precharge transistors.

For example, consider a scenario in which there are eight precharge transistors PP0-PP7. To turn on three of the eight transistors, any three programmable bits (e.g., bits B[0], B[2], and B[5]) can be driven high to enable the corresponding precharge transistors (e.g., transistors PP0, PP2, and PP5). The remaining programmable bits may be driven low to disable the remaining precharge transistors. There may be any number of programmable precharge transistors in circuit 50'. In general, there may be (n+1) programmable transistors, where the $(n+1)^{th}$ programmable transistor (e.g., transistor PPn) is controlled by bit B[n].

As shown in FIG. 7, programmable latch circuit 54' may include programmable latch transistors such as transistors PP0', PP1', etc. Each programmable latch transistor may be coupled between the power supply line and intermediate node NI. As with circuit 50', each programmable latch transistor may be controlled by a control gate such as NAND gate 72. Each NAND gate 72 may have a first input that is controlled by signal PREC and a second input controlled by a programmable bit such as bits B'[0], B'[1], etc. from a respective memory cell 46. The programmable latch transistors in circuit 54' need not be sized the same as the programmable precharge transistors in circuit 50'. If desired, there may be a different number of precharge transistors PPx (i.e., transistors PP0, PP1, ... PPn) and latch transistors PPx' (i.e., transistors PP0', PP1', ... PPm'). In general, there may be (m+1) programmable latch transistors, where the $(m+1)^{th}$ programmable latch transistor (e.g., transistor PPm') is controlled by bit B'[n].

Figure 8A:
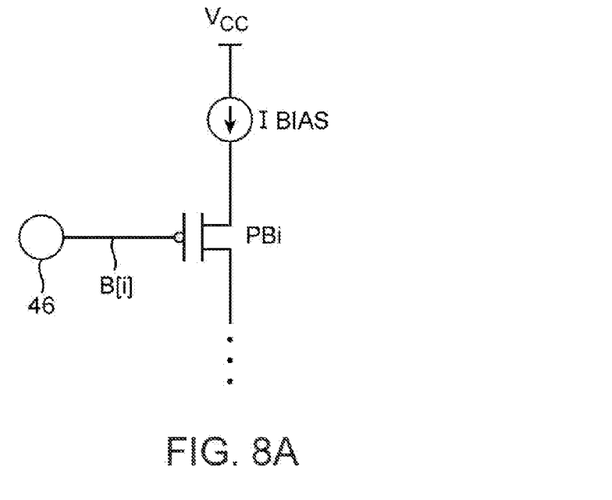
FIGS. 8A and 8B are circuit diagrams of an illustrative current source in accordance with an embodiment of the present invention.
Figure 8B:
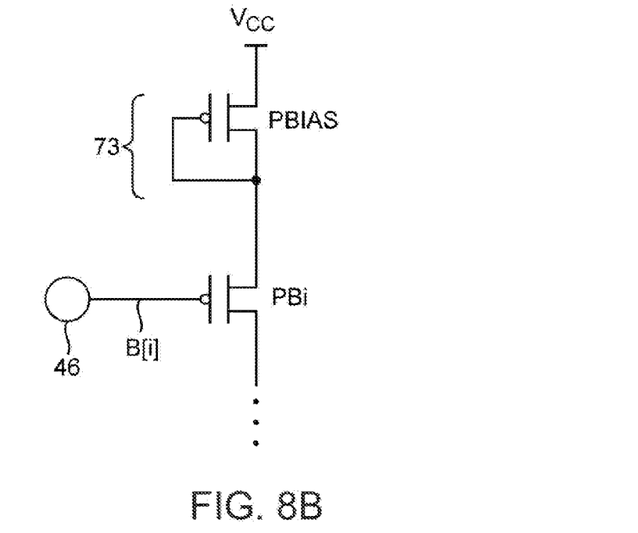

It may be desirable to provide a current source such as current source IBIAS of FIG. 8A in some of the pull-up current paths. For example, current source 73 may be inserted between the power supply line and a general programmable transistor such as programmable transistor PBi, as shown in FIG. 8B. Programmable transistor PBi may be controlled by a bit B[i] that is provided by storage element 46. Programmable transistor PBi may represent any selected group of transistors PBx in circuit 50, transistors PBx' in circuit 54, transistors PPx is circuit 50', and transistors PPx' in circuit 54'. Current source 73 may be implemented using a PMOS transistor such as transistor PBIAS that has a gate terminal shorted to its drain terminal (also known as a "diode-connected" transistor). Any suitable implementation of a current source may be used.

Figure 9:
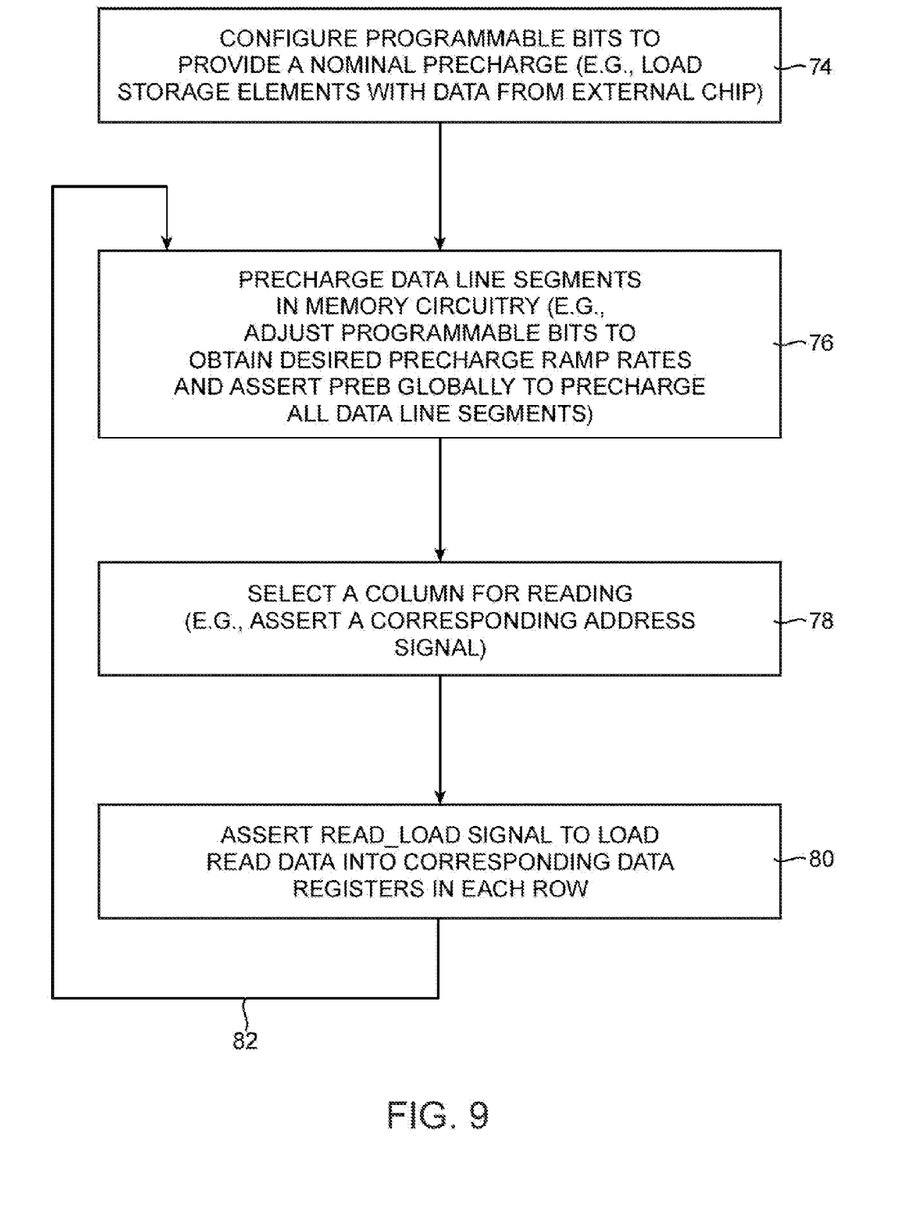
FIG. 9 is a flow chart of illustrative steps involved in reading data from memory circuitry in accordance with an embodiment of the present invention.

FIG. 9 shows illustrative steps involved in reading data from memory circuitry in integrated circuit of FIG. 1. During setup operations in step 74, programmable bits that control the programmable and latch circuits may be configured to provide a desired precharge rate. For example, cells 46 may be programmed by loading cells 46 with configuration data from an external chip. Cells 46 may also be configured by programming nonvolatile fuses or antifuses during manufacturing operations (e.g., during product testing).

Process, voltage, and temperature (PVT) variations during actual operations of integrated circuit 10 may cause the memory circuitry to operate differently than expected (e.g., by exhibiting a precharge ramp rate that is different from a nominal precharge rate). To counteract these variations, the programmable bits that control the programmable precharge and latch circuits may be adjusted during step 74. Once the programmable circuits have been adjusted properly, optimum precharge ramp rates will be produced during operation (step 76).

During data read operations, each data line may be precharged by asserting signal PREB across the entire integrated circuit. Asserting precharge signal PREB may fully charge up data lines DL to supply voltage level Vcc (step 76).

At step 78, a column of memory cells may be selected for reading by asserting a corresponding address signal. Each data line may discharge towards zero volts or may remain charged depending on the value stored on each selected memory cell. Read circuits 24 are enabled to allow data to flow to data register circuitry 12.

At step 80, signal READ_LOAD is asserted to load the read data into corresponding data registers (step 80). Processing may loop back to step 76 to read another column of memory cells, as indicated by path 82.

The foregoing is merely illustrative of the principles of this invention and various modifications can be made by those skilled in the art without departing from the scope and spirit of the invention.

What is claimed is:

1. An integrated circuit having a positive power supply line, comprising:
   a data line;
   a plurality of memory cells coupled to the data line;
   a plurality of storage elements that provide control bits;

a programmable-strength precharge circuit coupled between the positive power supply line and the data line, wherein the programmable-strength precharge circuit includes at least a first precharge transistor having a gate operable to receive a precharge signal, wherein the programmable-strength precharge circuit is controlled using the control bits in the plurality of storage elements; and a programmable-strength pull-up circuit coupled between the positive power supply line and the data line, wherein the programmable-strength precharge circuit is turned on for a first time period and wherein the programmable-strength pull-up circuit is turned on for a second time period that overlaps with only a portion of the first time period to charge the data line.

2. The integrated circuit defined in claim 1, further comprising:
  a latch circuit coupled to the data line, wherein the latch circuit includes an intermediate node that is coupled between the positive power supply line and the data line, wherein the programmable-strength pull-up circuit is coupled between the positive power supply line and the intermediate node.

3. The integrated circuit defined in claim 2, wherein the latch circuit comprises first and second series-connected n-channel metal-oxide-semiconductor (NMOS) transistors and a latch inverter, wherein the latch inverter has an input that is coupled to the data line and an output that is coupled to a first gate terminal of the first NMOS transistor, and wherein the second NMOS transistor has a second gate terminal controlled by the precharge signal.

4. The integrated circuit defined in claim 3, further comprising a logic gate, wherein the logic gate has first and second inputs, wherein the first input is coupled to the output of the latch inverter, and wherein the second input is controlled by the precharge signal.

5. The integrated circuit in claim 1, wherein the programmable-strength precharge further comprises at least a second precharge transistor, wherein the second precharge transistor has a gate operable to receive at least one of the control bits.

6. The integrated circuit defined in claim 5, further comprising at least one current source coupled between the positive power supply line and the first and second precharge transistors.

7. An integrated circuit having a positive power supply line, comprising:
  a data line;
  a plurality of memory cells coupled to the data line;
  a latch circuit that is coupled to the data line and that receives a precharge signal for precharging the data line, wherein the latch circuit includes an intermediate node that is coupled between the positive power supply line and the data line; and
  a programmable-strength pull-up circuit that receives the precharge signal and that is coupled between the positive power supply line and the intermediate node, wherein the latch circuit is configured to isolate the programmable-strength pull-up circuit from the data line when the data line is less than an intermediate threshold voltage level and is configured to electrically couple the programmable-strength pull-up circuit to the data line when the data line exceeds the intermediate threshold voltage level.

8. The integrated circuit defined in claim 7, wherein the latch circuit comprises first and second series-connected n-channel metal-oxide-semiconductor (NMOS) transistors and a latch inverter, wherein the latch inverter has an input that is coupled to the data line and an output that is coupled to a first gate terminal of the first NMOS transistor, and wherein the second NMOS transistor has a second gate terminal controlled by the precharge signal.

9. The integrated circuit defined in claim 8, further comprising: an additional data line and a logic gate, wherein the logic gate has first and second inputs and an output, wherein the first input is coupled to the output of the latch inverter, wherein the second input is controlled by the precharge signal, and wherein the output is coupled to the additional data line.

10. The integrated circuit defined in claim 8, further comprising a logic gate, wherein the logic gate has first and second inputs, wherein the first input is coupled to the output of the latch inverter, and wherein the second input is controlled by the precharge signal.

11. The integrated circuit defined in claim 10, further comprising a programmable-strength precharge circuit coupled between the positive power supply line and the data line.

12. The integrated circuit defined in claim 7, where the programmable strength pull-up circuit further comprises current sources coupled between the positive power supply line and the intermediate node.

13. The integrated circuit in claim 7, wherein the programmable-strength pull-up circuit comprises multiple pull-up transistors, wherein each pull-up transistor has a gate terminal that is connected to an output of a respective logic gate having first and second inputs, wherein the first inputs are controlled by a precharge signal, and wherein the second inputs are controlled by respective programmable bits.

14. An integrated circuit having a positive power supply line, comprising:
  a data line;
  a plurality of memory cells connected to the data line;
  a latch circuit connected to the data line, wherein the latch circuit includes first and second series-connected n-channel metal-oxide-semiconductor (NMOS) transistors and a latch inverter, wherein the latch inverter has an input that is connected to the data line and an output, wherein the first NMOS transistor has a first gate terminal connected to the output, and wherein the second NMOS transistor has a second gate terminal controlled by a precharge signal; and
  programmable-strength precharge circuitry coupled between the positive power supply line and the data line, wherein the programmable-strength precharge circuitry includes groups of precharge circuits that are coupled in parallel and that are controlled by the precharge signal, and wherein at least one of the groups of precharge circuits charges the data line.

15. The integrated circuit defined in claim 14, further comprising:
  a logic gate, wherein the logic gate has first and second inputs, wherein the first input is connected to the output of the latch inverter, and wherein the second input is controlled by the precharge signal.

16. The integrated circuit defined in claim 14, further comprising a logic gate, wherein the logic gate has first and second inputs, wherein the first input is connected to the output of the latch inverter, and wherein the second input is controlled by the precharge signal.

17. The integrated circuit defined in claim 16, wherein the logic gate has an output that is connected to a chain of inverters.

18. The integrated circuit defined in claim 7, wherein the latch circuit includes first circuitry interposed between the data line and the positive power supply line and second circuitry that controls the first circuitry in response to voltages on the data line.

\* \* \* \* \*